United States Patent
Perrott et al.

(10) Patent No.: US 11,601,089 B1
(45) Date of Patent: Mar. 7, 2023

(54) BAW OSCILLATORS WITH DUAL BAW TEMPERATURE SENSING

(71) Applicant: Texas Instruments Incorporated, Dallas, TX (US)

(72) Inventors: Michael Henderson Perrott, Nashua, NH (US); Ting-Ta Yen, San Jose, CA (US); Bichoy Bahr, Allen, TX (US); Baher S. Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/463,406

(22) Filed: Aug. 31, 2021

(51) Int. Cl.
*H03B 5/32* (2006.01)
*H03L 7/093* (2006.01)
*H03L 7/099* (2006.01)
*H03B 5/04* (2006.01)

(52) U.S. Cl.
CPC ............ *H03B 5/326* (2013.01); *H03B 5/04* (2013.01); *H03L 7/093* (2013.01); *H03L 7/0992* (2013.01)

(58) Field of Classification Search
USPC ........................................................ 331/158
See application file for complete search history.

(56) References Cited

U.S. PATENT DOCUMENTS

| | | | |
|---|---|---|---|
| 6,831,525 B1* | 12/2004 | Beaudin | H03L 1/00 331/46 |
| 8,581,671 B2* | 11/2013 | Akaike | H03L 1/026 331/116 R |
| 2009/0146746 A1* | 6/2009 | Unkrich | H03L 7/099 331/70 |

* cited by examiner

*Primary Examiner* — Joseph Chang
(74) *Attorney, Agent, or Firm* — Frank D. Cimino

(57) ABSTRACT

A temperature compensated oscillator circuit includes a first oscillator, a second oscillator, a first divider, a second divider, a frequency ratio circuit, and a temperature compensation circuit. The first divider is coupled to the first oscillator, and is configured to divide a frequency of a first oscillator signal generated by the first oscillator. The second divider is coupled to the second oscillator, and is configured to divide a frequency of a second oscillator signal generated by the second oscillator. The frequency ratio circuit is coupled to the first divider and the second divider, and is configured to determine a frequency ratio of an output of the first divider to an output of the second divider. The temperature compensation circuit is coupled to the frequency ratio circuit and the first oscillator, and is configured to generate a compensated frequency based on the frequency ratio and the first oscillator signal.

30 Claims, 7 Drawing Sheets

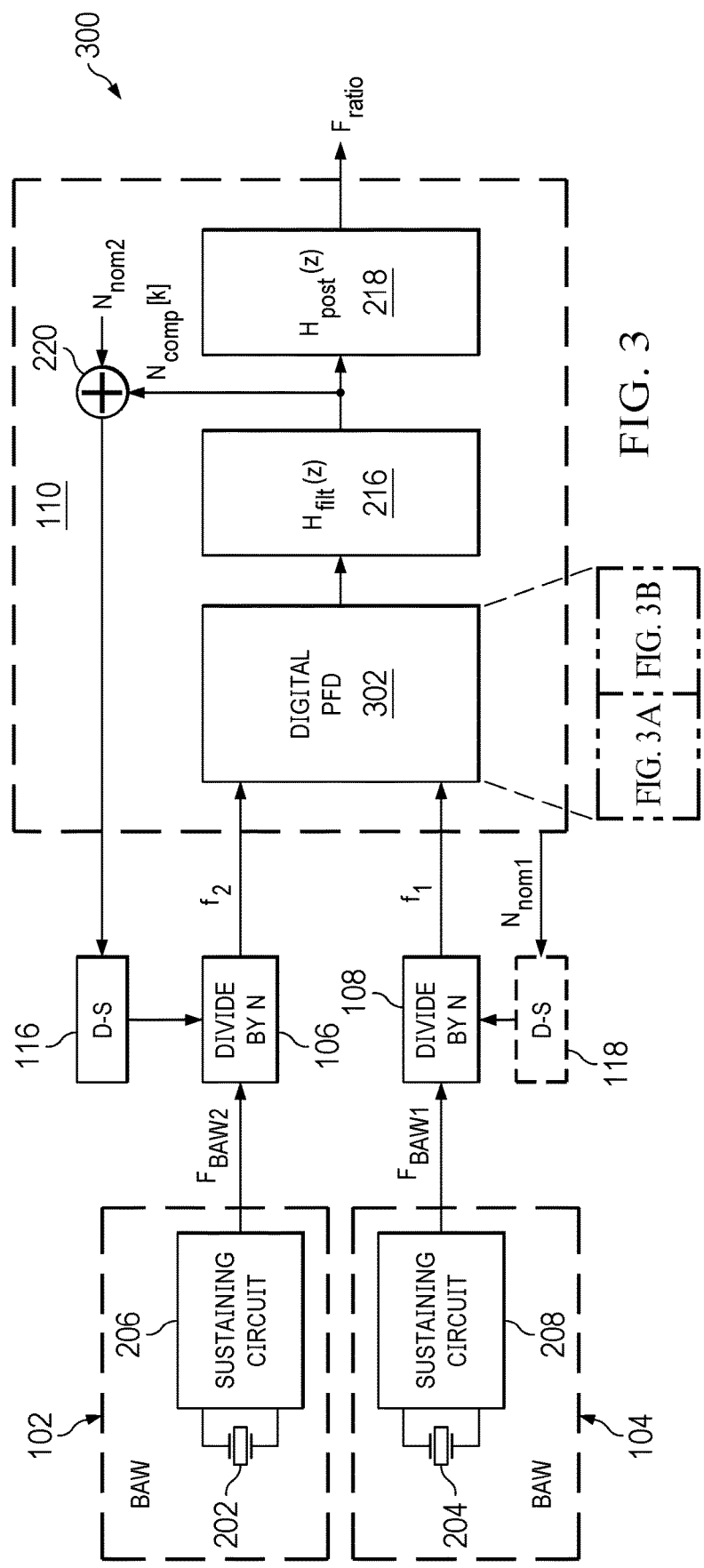
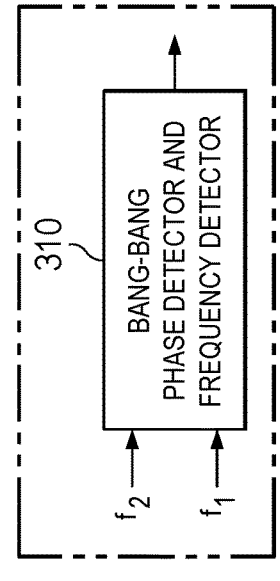
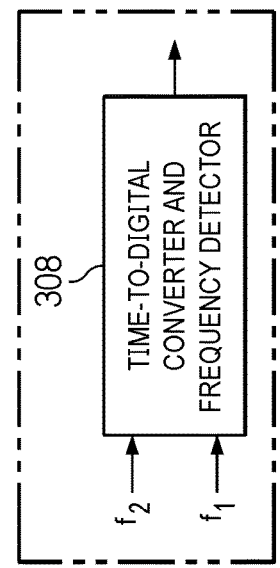
FIG. 3
FIG. 3B
FIG. 3A

BAW OSCILLATORS WITH DUAL BAW TEMPERATURE SENSING

BACKGROUND

A resonator is a device or system that naturally oscillates at frequencies called resonant frequencies. Resonators can be, for example, crystal resonators (also known as quartz resonators), inductance-capacitance (LC) resonators, or microelectromechanical systems (MEMS) resonators, also referred to as MEMS resonators. Resonators are generally passive devices that are combined with active circuitry to create an oscillator. The oscillator produces a periodic signal at the resonant frequency. A crystal oscillator, for example, is an electronic circuit that uses the mechanical resonance of a vibrating crystal to create an electrical signal with a very precise frequency. Crystal oscillators may be used to generate frequencies to keep track of time or to generate a clock signal for digital integrated circuits. MEMS resonators may be used in place of crystal resonators to keep track of time and to generate a stable clock signal for analog and digital integrated circuits.

SUMMARY

In one example, a temperature compensated oscillator circuit includes a first oscillator, a second oscillator, a first divider, a second divider, a frequency ratio circuit, and a delta-sigma modulator. The first oscillator includes an output. The second oscillator includes an output. The first divider includes a first input, a second input, and an output. The first input of the first divider is coupled to the output of the first oscillator. The second divider includes an input and an output. The input of the second divider is coupled to the output of the second oscillator. The frequency ratio circuit includes a first input, a second input, and an output. The first input of the frequency ratio circuit is coupled to the output of the first divider. The second input of the frequency ratio circuit is coupled to the output of the second divider. The delta-sigma modulator includes an input and an output. The input of the delta-sigma modulator is coupled to the output of the frequency ratio circuit. The output of the delta-sigma modulator is coupled to the first divider.

In another example, a temperature compensated oscillator circuit includes a first oscillator, a second oscillator, a first divider, a second divider, a frequency ratio circuit, and a temperature compensation circuit. The first divider is coupled to the first oscillator, and is configured to divide a frequency of a first oscillator signal generated by the first oscillator. The second divider is coupled to the second oscillator, and is configured to divide a frequency of a second oscillator signal generated by the second oscillator. The frequency ratio circuit is coupled to the first divider and the second divider, and is configured to determine a frequency ratio of an output of the first divider to an output of the second divider. The temperature compensation circuit is coupled to the frequency ratio circuit and the first oscillator, and is configured to generate a compensated frequency based on the frequency ratio and the first oscillator signal.

In a further example, a temperature compensated oscillator circuit includes a first bulk acoustic wave (BAW) oscillator, a second BAW oscillator, a first divider, a second divider, a phase-frequency detector, a first frequency compensation circuit, and a second frequency compensation circuit. The first divider is coupled to the first BAW oscillator, and is configured to divide a frequency of a first oscillator signal generated by the first BAW oscillator. The second divider is coupled to the second BAW oscillator, and is configured to divide a frequency of a second oscillator signal generated by the second BAW oscillator. The phase-frequency detector is coupled to the first divider and the second divider, and is configured to measure a phase difference of an output of the first divider and an output of the second divider. The first frequency compensation circuit is coupled to the phase-frequency detector and the first BAW oscillator, and is configured to adjust the frequency of the first oscillator signal based on the phase difference. The second frequency compensation circuit is coupled to the phase-frequency detector and the second BAW oscillator, and is configured to adjust the frequency of the second oscillator signal based on the phase difference.

BRIEF DESCRIPTION OF THE DRAWINGS

FIG. 3 shows a block diagram for example $F_{ratio}$ calculation circuitry suitable for use in a temperature compensated dual BAW oscillator.

FIGS. 3A and 3B show digital phase/frequency detectors suitable for use in the $F_{ratio}$ calculation circuitry of FIG. 3.

DETAILED DESCRIPTION

Figure 1:
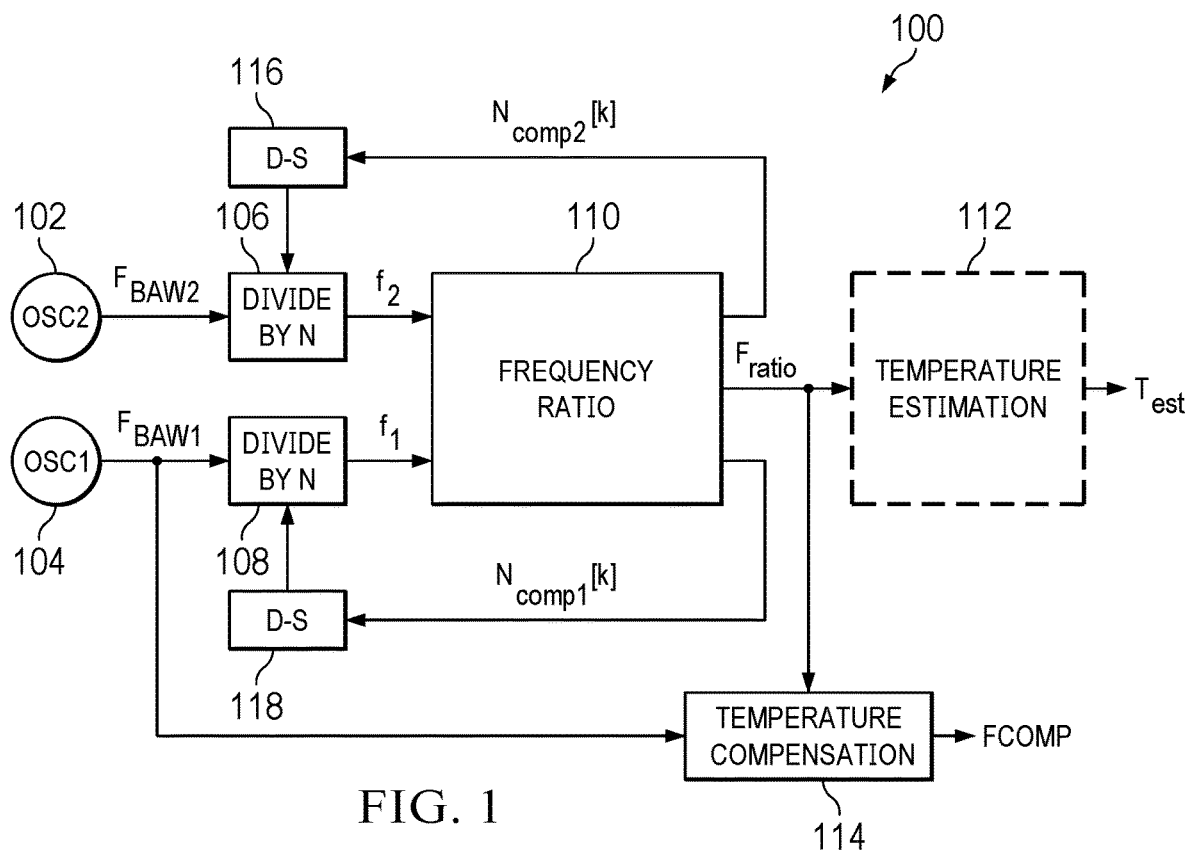
FIG. 1 shows a block diagram for an example temperature compensated dual bulk acoustic wave (BAW) oscillator.

Oscillator circuits implemented using resonators, such as bulk acoustic wave (BAW) resonators, exhibit frequency variation with temperature. In some applications high clock stability is important, and reduction of this temperature dependent frequency variation is desirable. To reduce frequency variation due to temperature, some temperature compensated BAW oscillators include a temperature sensor and frequency compensation circuit. The temperature sensor measures an estimated temperature of the oscillator die, and the frequency compensation circuit adjusts the output frequency of the temperature-compensated BAW oscillator based on the estimated temperature. The stability of the output frequency is a function of the bandwidth, noise, and accuracy of the temperature sensor. The frequency compensation circuit may apply various techniques to adjust the output frequency of the temperature-compensated BAW oscillator. For example, the frequency compensation circuit may pull the BAW resonator frequency using capacitive tuning, tune a fractional frequency divider coupled to the BAW oscillator, or tune a fractional phase-locked-loop coupled to the BAW oscillator.

Rather than using an express temperature sensor circuit, some temperature compensated BAW oscillators use two oscillators with different temperature sensitivities to estimate temperature. For example, a first oscillator has high temperature sensitivity and a second oscillator has low temperature sensitivity. Temperature is estimated based on a ratio of the frequencies of the two oscillators and the estimated temperature is provided to a frequency compensation circuit to adjust the output frequency of the temperature compensated BAW oscillator. Some temperature compensated BAW oscillators may include counters to determine the ratio of frequencies of the two BAW oscillators. Some temperature compensated BAW oscillators use a VCO-based phase-locked loop (PLL) to increase the number of edges of one of the oscillators, and provide fractional division for calculation of the frequency ratio. Addition of the PLL increases power consumption, noise, circuit area and complexity.

Some temperature compensated BAW oscillators described herein avoid the issues arising from use of a VCO-based PLL for calculation of the frequency ratio by providing fractional frequency division at the outputs of the two BAW oscillators. A frequency divider is coupled to each of the BAW oscillators, and at least one of the frequency dividers is controlled by a digital delta-sigma modulator. The frequency dividers are controlled to enable phase locking of frequency divider outputs. Thus, the average output frequencies of the two dividers are made equal. The ratio of the two oscillator frequencies may be calculated based on the divider values applied in the frequency dividers. The estimated temperature may be determined based on ratio of the two oscillator frequencies. Frequency compensation of one or both BAW oscillators is achieved using the ratio of the two oscillator frequencies; or using the estimated temperature.

FIG. 1 shows a block diagram for an example temperature compensated dual BAW oscillator 100. The temperature compensated dual BAW oscillator 100 includes a BAW oscillator 102, a BAW oscillator 104, a divider 106, a divider 108, a frequency ratio circuit 110, a temperature estimation circuit 112, a temperature compensation circuit 114, a delta-sigma modulator 116, and a delta-sigma modulator 118. The temperature estimation circuit 112 may not be included in some implementations of the temperature compensated dual BAW oscillator. The BAW oscillator 102 and the BAW oscillator 104 may provide a similar oscillation frequency, which may include an oscillation frequency above 1 gigahertz (GHz) (e.g., 2.5 GHz). The two BAW oscillators have different temperature sensitivities. For example, the BAW oscillator 104 may include a BAW resonator formed of aluminum nitride (AlN) with a silicon dioxide layer to provide relative low temperature sensitivity, and the BAW oscillator 102 may include a BAW resonator formed of only AlN to provide a higher temperature sensitivity. The high oscillation frequency of the BAW oscillator 102 and BAW oscillator 104 allows the temperature compensated dual BAW oscillator 100 to avoid use of a VCO-based phase-locked loop to calculate the frequency ratio.

An output of the BAW oscillator 102 is coupled to an input of the divider 106, and an output of the BAW oscillator 104 is coupled to an input of the divider 108. The divider 106 and the delta-sigma modulator 116 provide fractional frequency division to the output signal of the BAW oscillator 102. The divider 108 and delta-sigma modulator 118 provide fractional frequency division to the output signal of the BAW oscillator 104. The divider 106 divides the frequency ($F_{BAW2}$) of output signal of the BAW oscillator 102, and the divider 108 divides the frequency ($F_{BAW1}$) of the output signal of the BAW oscillator 104. The delta-sigma modulator 116 provides a divisor to the divider 106, and the delta-sigma modulator 118 provides a divisor to the divider 108. Some implementations of the temperature compensated dual BAW oscillator 100, may include only one of the delta-sigma modulator 116 or the delta-sigma modulator 118.

A first input of the frequency ratio circuit 110 is coupled to an output of the divider 106, and a second input of the frequency ratio circuit 110 is coupled to an output of the divider 108. The frequency ratio circuit 110 can include phase/frequency detection circuitry, analog filtering, analog-to-digital conversion (ADC) circuitry, and digital filtering circuitry. The phase/frequency detection circuitry may be analog or digital in various embodiments of the frequency ratio circuit 110. The frequency ratio circuit 110 generates divider values, $N_{comp1}[k]$ and $N_{comp2}[k]$, that are provided to the delta-sigma modulator 118 and the delta-sigma modulator 116 respectively. A first output of the frequency ratio circuit 110 is coupled to an input of the delta-sigma modulator 116, and second output of the frequency ratio circuit 110 is coupled to an input of the delta-sigma modulator 118 for transfer of the divider values from the frequency ratio circuit 110 to the delta-sigma modulator 116 and the delta-sigma modulator 118. The divider values control the divider 106 and the divider 108 to phase lock the output signals of the divider 106 and the divider 108. The phase locked output signals of the divider 106 and the divider 108 are controlled by the frequency ratio circuit 110 such that the average frequency ($f_2$) of the output signal of the divider 106 is equal to the average frequency ($f_1$) of the output signal of the divider 108. The frequency ratio ($F_{ratio}$) of the output signals of the BAW oscillator 102 and the BAW oscillator 104 is calculated based on the divider values $N_{comp1}[k]$ and $N_{comp2}[k]$.

The temperature estimation circuit 112 estimates the temperature (Test) based on the frequency ratio. For example, the temperature estimation circuit 112 may apply polynomial mapping to estimate temperature based on the frequency ratio. An input of the temperature estimation circuit 112 is coupled to a third output of the frequency ratio circuit 110 for receipt of the frequency ratio.

The temperature compensation circuit 114 adjusts the output frequency of the temperature compensated dual BAW oscillator 100 based on $F_{ratio}$ directly, or on a signal derived from $F_{ratio}$, such as estimated temperature. An input of the temperature compensation circuit 114 is coupled to the output of the BAW oscillator 104 for receipt of the output signal of the BAW oscillator 104 (the frequency to be compensated), and an input of the temperature compensation circuit 114 is coupled to an output of the frequency ratio circuit 110 for receipt of the frequency ratio.

In some implementations of the temperature compensated dual BAW oscillator 100, the temperature compensation circuit 114 can directly utilize $F_{ratio}$ rather than explicitly calculating temperature. In some implementations of the frequency ratio circuit 110, the value $F_{ratio}$ is utilized to compute a frequency compensation signal to which the temperature compensation circuit 114 is responsive. More generally, the frequency ratio circuit 110 senses frequency error such that the appropriate divide value(s) can be selected to achieve equal frequencies at the outputs of the dividers 106 and 108. The frequency ratio circuit 110 derives a signal from the two BAW frequencies which maps consistently to temperature induced frequency variation of at least one of the BAW frequencies, and the temperature compensation circuit 114 uses this signal to compensate at least one of the BAW frequencies.

Figure 2:
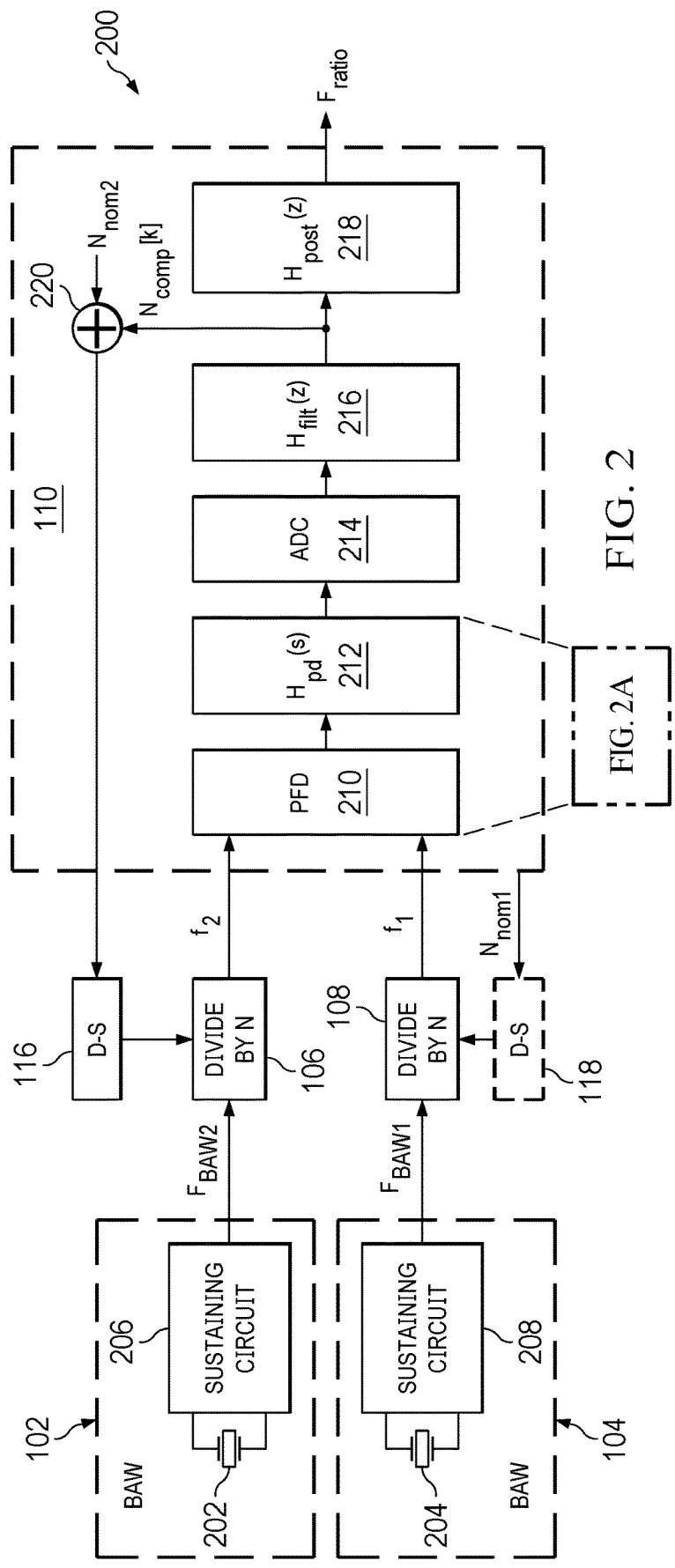
FIG. 2 shows a block diagram for example frequency ratio ($F_{ratio}$) calculation circuitry suitable for use in a temperature compensated dual BAW oscillator.

FIG. 2 shows a block diagram for example $F_{ratio}$ calculation circuitry 200 suitable for use in the temperature compensated dual BAW oscillator 100. FIG. 2 shows additional detail of an implementation of the frequency ratio circuit 110 that includes analog phase/frequency detection and filtering. The analog phase/frequency detection provides good noise performance and linear dynamics at steady-state.

The BAW oscillator 102 includes a BAW resonator 202 and a sustaining circuit 206. The sustaining circuit 206 produces oscillation (an oscillating output signal) at a frequency set by the BAW resonator 202. The BAW resonator 202 may be formed of only AlN to provide a relatively high temperature sensitivity. The BAW oscillator 104 includes a BAW resonator 204 and a sustaining circuit 208. The sustaining circuit 208 may be similar or identical to the sustaining circuit 206. The BAW resonator 204 may be formed of aluminum nitride (AlN) with a silicon dioxide layer to provide a lower temperature sensitivity than the BAW resonator 202.

The frequency ratio circuit 110 includes a phase/frequency detector 210, a filter 212, an ADC 214, a filter 216, a filter 218, and an adder 220. The phase/frequency detector 210 determines a difference in phase/frequency of the outputs of the divider 106 and divider 108. The phase/frequency detector 210 includes an input coupled to the output of the divider 106, and an input coupled to the output of the divider 108. The filter 212 low-pass filters the output of the phase/frequency detector 210 for digitization by the ADC 214. The filter 212 includes an input coupled to the output of the phase/frequency detector 210, and an output coupled to an input of the ADC 214. The filter 216 filters the output of the ADC 214 to produce a divider compensation value ($N_{comp}$[k]). The filter 216 includes an input coupled to the output of the ADC 214. The filter 218 filters the output of the filter 216 to produce the frequency ratio $F_{ratio}$.

The adder 220 sums a nominal divider value ($N_{nom}2$) with the divider compensation value to produce the divider value provided to the delta-sigma modulator 116. The frequency ratio circuit 110 provides a nominal divider value ($N_{nom}1$) to the delta-sigma modulator 118 in implementations that include the delta-sigma modulator 118.

Figure 2A:
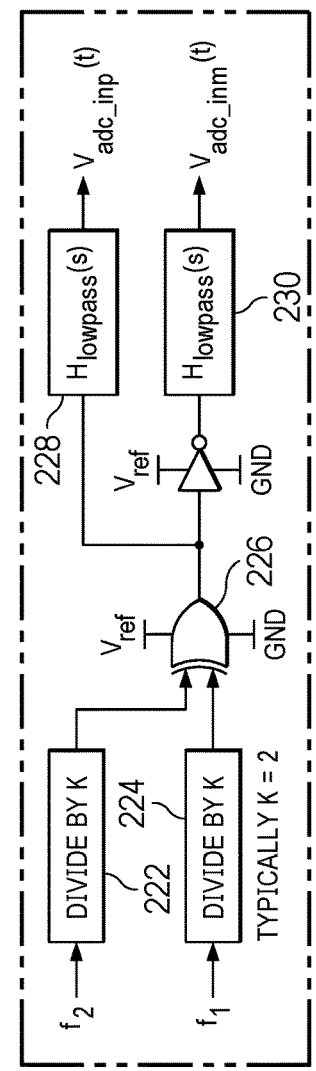
FIG. 2A shows detail of phase/frequency detection and filtering circuitry in the $F_{ratio}$ calculation circuitry of FIG. 2.

FIG. 2A shows detail of the phase/frequency detector 210 and the filter 212. The phase/frequency detector 210 includes a divider 222 and a divider 224. An input of the divider 222 is coupled to the output of the divider 106, and an input of the divider 224 is coupled to the output of the divider 108. The divider 222 and the divider 224 divide the frequencies of the output signals generated by the divider 106 and the divider 108 by a constant (e.g., 2). An exclusive-OR (XOR) gate 226 compares the output signals of the divider 222 and the divider 224 to determine the difference in phase/frequency of the two output signals.

Low pass filters 228 and 230 filter non-inverted and inverted versions of the output of the XOR gate 226 to form a differential signal to be digitized by the ADC 214.

The XOR gate 226 is one example of an "analog" phase/frequency detector 210. Other phase/frequency detectors are possible, including the classical tristate phase/frequency detector which generates Up/Dn signals. Note that the XOR-based phase detector of FIG. 2A may be augmented with a frequency detection circuit since phase locking requires a relatively small initial frequency difference.

FIG. 3 shows a block diagram for example $F_{ratio}$ calculation circuitry 300 suitable for use in the temperature compensated dual BAW oscillator 100. The $F_{ratio}$ calculation circuitry 300 includes digital phase/frequency detector 302 in place of the analog phase/frequency detector 210 of the $F_{ratio}$ calculation circuitry 200. The digital phase/frequency detection allows for a fully digital implementation of the frequency ratio circuit 110.

FIG. 3A shows a first implementation of the digital phase/frequency detector 302 that includes a phase/frequency detector 308. The phase/frequency detector 308 includes a time-to-digital converter and a frequency detector circuit. FIG. 3B show a second implementation of the digital phase/frequency detector 302 that includes a phase/frequency detector 310. The phase/frequency detector 310 includes a bang-bang phase detector and a frequency detector.

Figure 4:
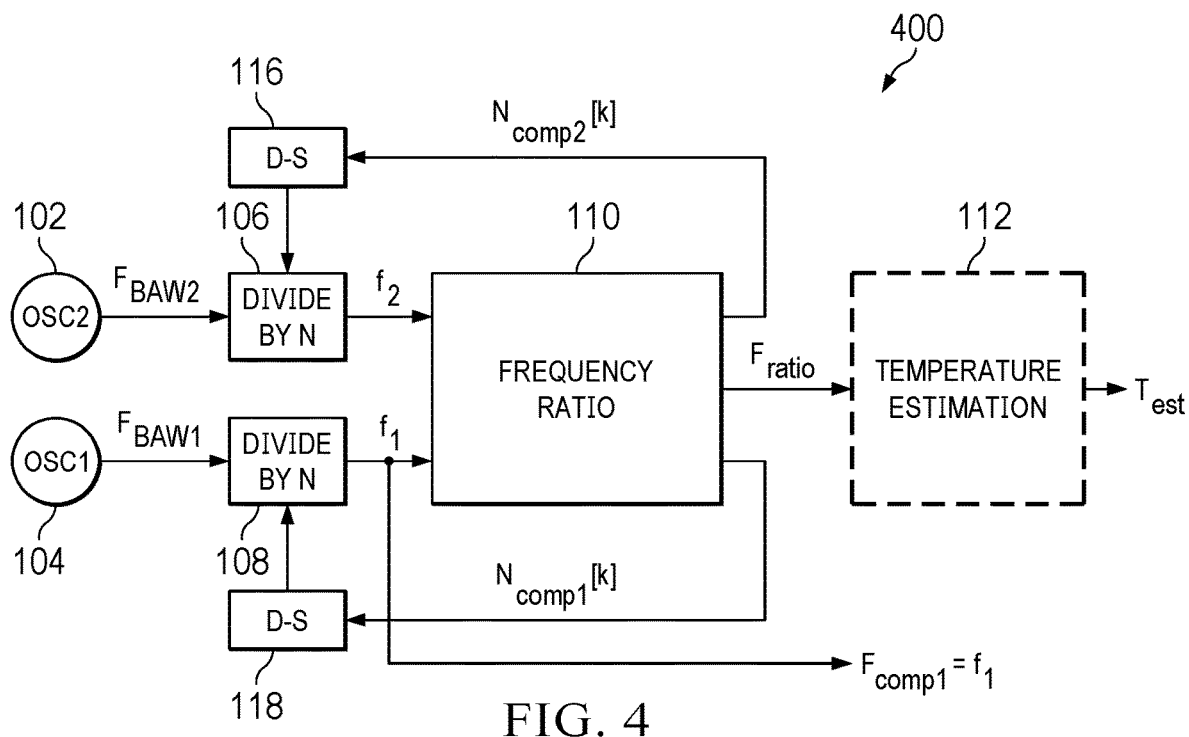
FIG. 4 shows a block diagram for another example of a temperature compensated dual BAW oscillator.

FIG. 4 shows a block diagram for an alternative temperature compensated dual BAW oscillator 400. The temperature compensated dual BAW oscillator 400 is similar to the temperature compensated dual BAW oscillator 100. In the temperature compensated dual BAW oscillator 400, the divider value Ncomp1 [k] is selected such that frequency f1 of the output signal generated by the divider 108 corresponds to the compensated version of the output of the BAW oscillator 102. Thus, the output signal of the divider 108 is compensated for temperature.

Figure 5:
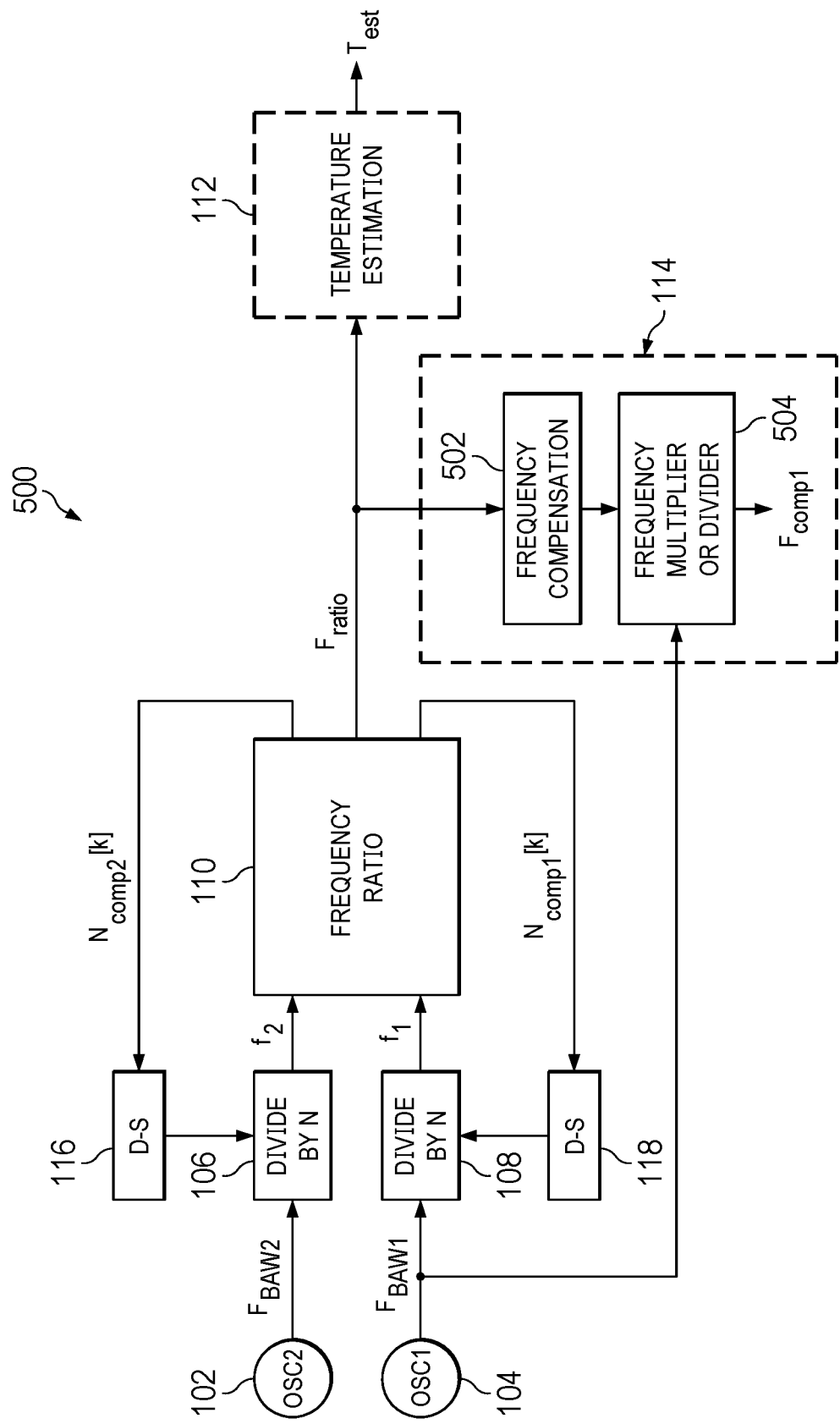
FIG. 5 shows a block diagram for another example temperature compensated dual BAW oscillator.

FIG. 5 shows a block diagram for another temperature compensated dual BAW oscillator 500. The temperature compensated dual BAW oscillator 500 is an implementation of the temperature compensated dual BAW oscillator 100. The temperature compensated dual BAW oscillator 500 provides independent selection of the compensated output frequency ($f_{comp1}$), with no need to align $f_{comp1}$ to the output signal of the divider 106. In the temperature compensated dual BAW oscillator 500, the temperature compensation circuit 114 includes a frequency compensation circuit 502 and a frequency multiplier/divider circuit 504. The frequency compensation circuit 502 generates a frequency compensation value based on the frequency ratio. For example, the frequency compensation circuit 502 applies a polynomial to compute the frequency compensation value based on the frequency ratio. An input of the frequency compensation circuit 502 is coupled to the frequency ratio circuit 110 for receipt of the frequency ratio. Alternatively, the frequency compensation value can be computed based on an estimated temperature value generated by the temperature estimation circuit 112.

The frequency multiplier/divider circuit 504 applies the frequency compensation value to generate a temperature compensated frequency output. The first input of the frequency multiplier/divider circuit 504 is coupled to the frequency compensation circuit 502, and a second input of the frequency multiplier/divider circuit 504 is coupled to the output of the BAW oscillator 104.

Figure 5A:
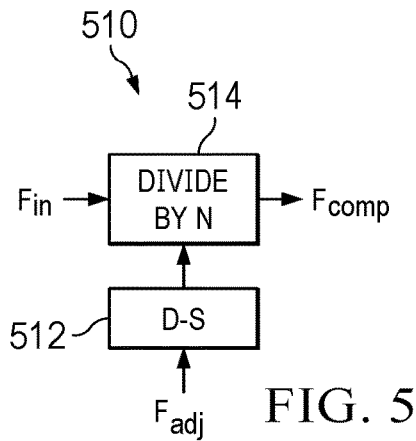
FIGS. 5A, 5B, and 5C show block diagrams for example frequency multiplier/divider circuits suitable for use in the temperature compensated BAW oscillator of FIG. 5.
Figure 5B:
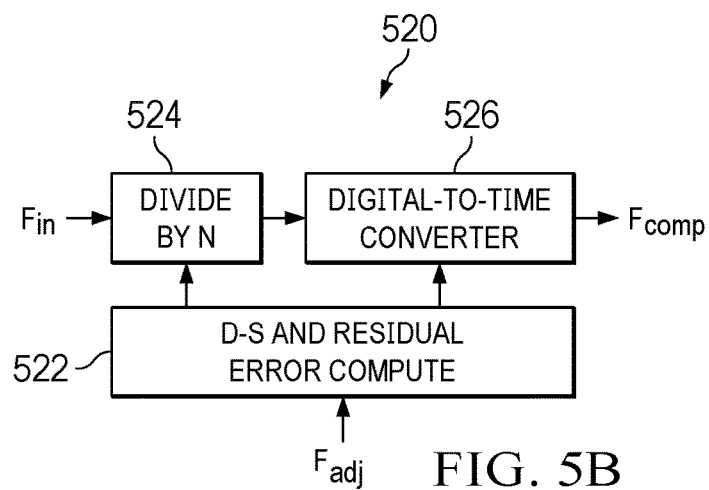
Figure 5C:
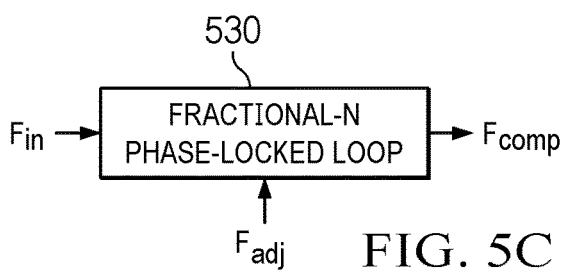

FIGS. 5A, 5B, and 5C show block diagrams for examples of the frequency multiplier/divider circuit 504. FIG. 5A shows a block diagram for a frequency multiplier/divider circuit 510. The frequency multiplier/divider circuit 510 is an embodiment of the frequency multiplier/divider circuit 504. The frequency multiplier/divider circuit 510 includes a delta-sigma modulator 512 and a divider 514. An input of the delta-sigma modulator 512 is coupled to the output of the frequency compensation circuit 502 for receipt of the frequency compensation value ($f_{adj}$). The delta-sigma modulator 512 utilizes the frequency compensation value to produce a divisor for use by the divider 514. A first input of the divider 514 is coupled to an output of the delta-sigma modulator 512, and a second input of the divider 514 is coupled to the output of the BAW oscillator 104. The divider 514 divides the output signal of the BAW oscillator 104 ($f_{in}$) by the divisor received from the delta-sigma modulator 512 to produce a temperature compensated frequency output ($f_{comp}$).

FIG. 5B shows a block diagram for a frequency multiplier/divider circuit 520. The frequency multiplier/divider circuit 520 is an embodiment of the frequency multiplier/divider circuit 504. The frequency multiplier/divider circuit 520 includes a delta-sigma modulation and residual computation circuit 522, a divider 524, and a digital-to-time converter 526. Jitter in the output of the frequency multiplier/divider circuit 520 is reduced relative to the frequency multiplier/divider circuit 510. An input of the delta-sigma modulation and residual computation circuit 522 is coupled to the output of the frequency compensation circuit 502 for receipt of the frequency compensation value. The delta-sigma modulation and residual computation circuit 522 utilizes the frequency compensation value to produce a divisor for use by the divider 524 and delay value for use by the digital-to-time converter 526. A first input of the divider 524 is coupled to an output of the delta-sigma modulation and residual computation circuit 522, and a second input of the divider 524 is coupled to the output of the BAW oscillator 104. The divider 524 divides the output signal of the BAW oscillator 104 by the divisor received from the delta-sigma modulation and residual computation circuit 522. An input of the digital-to-time converter 526 is coupled to an output of the divider 524 for receipt of the divided oscillator output, and a second input of the digital-to-time converter 526 is coupled to an output of the delta-sigma modulation and residual computation circuit 522 for receipt of the delay value. The digital-to-time converter 526 adds a delay amount according to the delay value in order to substantially reduce the impact of delta-sigma quantization noise that is present in the divider output due to the dynamic variation of its divide value, thereby achieving lower jitter for the frequency compensated output.

FIG. 5C shows a fractional-N PLL 530 suitable for use as the frequency multiplier/divider circuit 504. The fractional-N PLL 530 utilizes delta-Sigma modulation of the divider of the fractional-N PLL 530 in order to produce a desired average division value with high precision, and thereby achieve high precision frequency multiplication. A first input of the fractional-N PLL 530 is coupled to an output of the frequency compensation circuit 502, and a second input of the fractional-N PLL 530 is coupled to the output of the BAW oscillator 104. The fractional-N PLL 530 multiplies the output of the BAW oscillator 104 based on the frequency compensation value received from the frequency compensation circuit 502 to produce a temperature compensated frequency output. Low jitter in the temperature compensated frequency output can be achieved by using the fractional-N PLL 530. Note that the fractional-N PLL can be combined with one or more frequency dividers to achieve a very wide range of output frequencies such that either frequency multiplication or frequency division is achieved.

Figure 6:
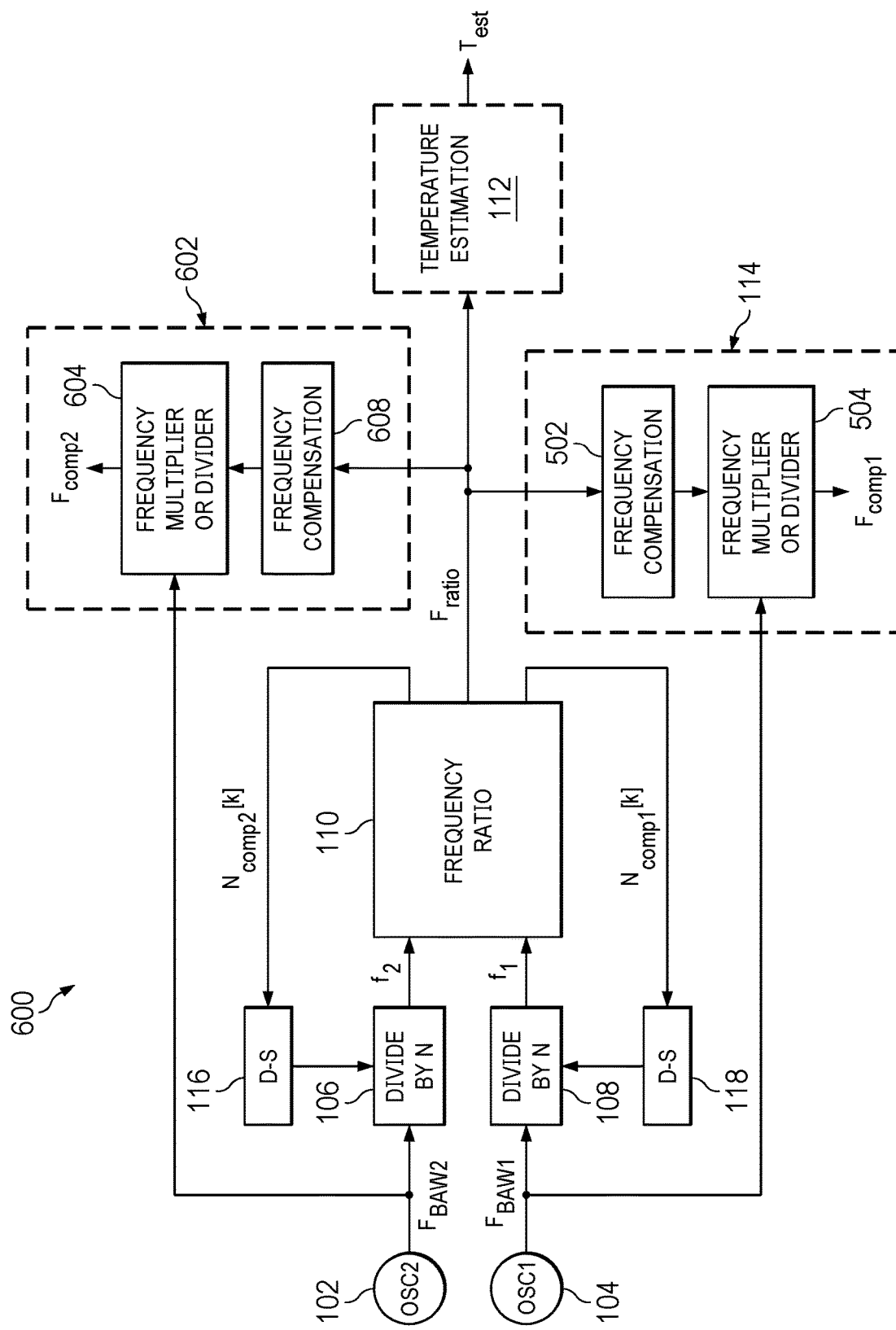
FIG. 6 shows a block diagram for another example temperature compensated dual BAW oscillator.

FIG. 6 shows a block diagram for another temperature compensated dual BAW oscillator 600. The temperature compensated dual BAW oscillator 600 is similar to the temperature compensated dual BAW oscillator 500, and includes a temperature compensation circuit 602 that compensates the output signal of the BAW oscillator 102. The temperature compensation circuit 602 is similar or identical to the temperature compensation circuit 114. The temperature compensation circuit 602 includes a frequency compensation circuit 608 and a frequency multiplier/divider circuit 604. The frequency multiplier/divider circuit 604 may be similar or identical to the frequency multiplier/divider circuit 504 (e.g., implemented as the frequency multiplier/divider circuit 510, the frequency multiplier/divider circuit 520, or the fractional-N PLL 530). The frequency compensation circuit 608 generates a frequency compensation value based on the frequency ratio. For example, the frequency compensation circuit 608 applies a polynomial to compute the frequency compensation value based on the frequency ratio. Alternatively, the frequency compensation can be computed based on estimated temperature. An input of the frequency compensation circuit 608 is coupled to the frequency ratio circuit 110 for receipt of the frequency ratio.

The frequency multiplier/divider circuit 604 applies the frequency compensation value to generate a temperature compensated frequency output. The first input of the frequency multiplier/divider circuit 604 is coupled to the frequency compensation circuit 608, and a second input of the frequency multiplier/divider circuit 604 is coupled to the output of the BAW oscillator 102.

Figure 7:
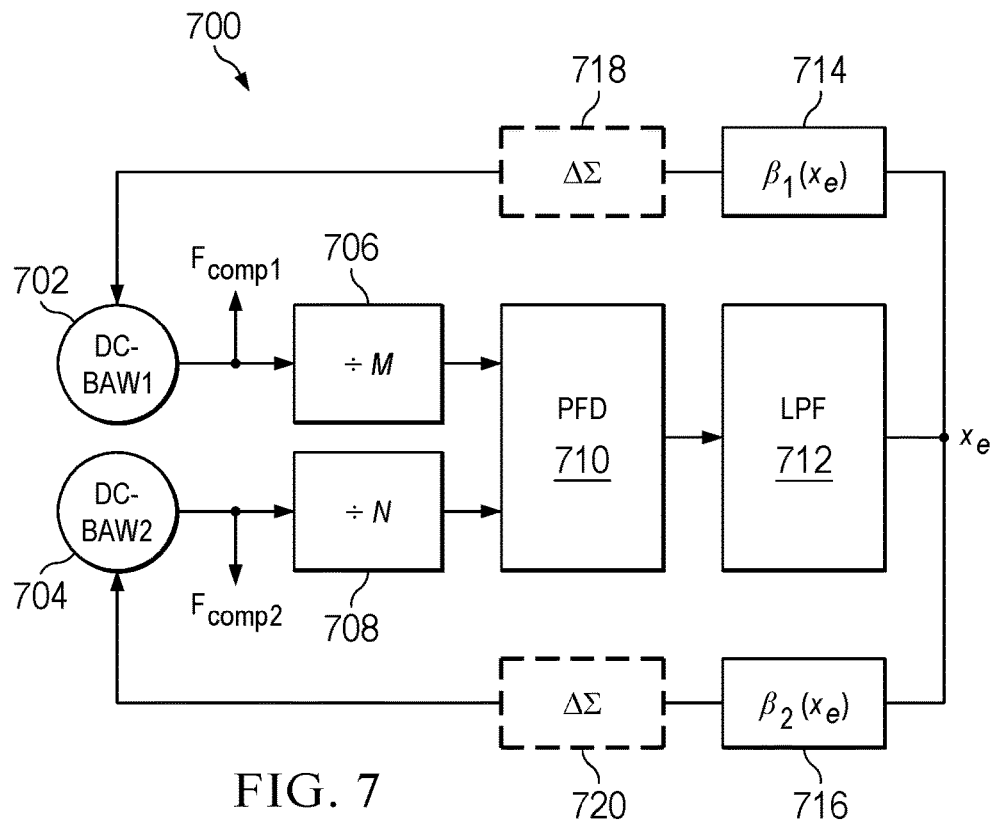
FIG. 7 shows a block diagram for another example temperature compensated dual BAW oscillator.

FIG. 7 shows a block diagram for another temperature compensated dual BAW oscillator 700. The temperature compensated dual BAW oscillator 700 includes a digitally-controlled BAW (DC-BAW) 702, a DC-BAW 704, a divider 706, a divider 708, a phase/frequency detector 710, a low-pass filter 712, a frequency control circuit 714, a frequency control circuit 716, a delta-sigma modulator 718, and a delta-sigma modulator 720. The DC-BAW 702 and the DC-BAW 704 may include one or more capacitors that are switchable to adjust the output frequency. The DC-BAW 702 and the DC-BAW 704 may be built as fixed frequency BAW oscillators, followed by a fractional output divider, or a fractional-N PLL. The DC-BAW 702 and the DC-BAW 704 can also be implemented as BAW oscillators including a voltage-controlled capacitor (varactor), where the control voltage is set through a digital-to-analog converter (DAC).

The divider 706 divides the frequency of output signal of the DC-BAW 702 by a constant (M). An input of the divider 706 is coupled to the output of the DC-BAW 702. The divider 708 divides the frequency of output signal of the DC-BAW 704 by a constant (N). An input of the divider 708 is coupled to the output of the DC-BAW 704. M and N may be arbitrary, and be 1 in some implementations, allowing for different frequencies of the DC-BAW 702 and the DC-BAW 704.

The phase/frequency detector 710 measures the difference in phase/frequency of the output signals of the divider 706 and the divider 708. A first input of the phase/frequency detector 710 is coupled to the output of the divider 706, and a second input of the phase/frequency detector 710 is coupled to the output of the divider 708. The low-pass filter 712 low-pass filters (smooths) the output signal of the phase/frequency detector 710. An input of the low-pass filter 712 is coupled to the output of the phase/frequency detector 710. The phase/frequency detector 710 and the low-pass filter 712 are digital circuits.

The frequency control circuit 714 applies the output signal ($x_e$) of the low-pass filter 712 as input to a polynomial ($\beta_1/(x_e)$) to calculate an adjustment to the frequency of the output signal of the DC-BAW 702. The frequency control circuit 716 applies the output signal ($x_e$) of the low-pass filter 712 as input to a polynomial ($\beta_2(x_e)$) to calculate an adjustment to the frequency of the output signal of the DC-BAW 704. More specifically, the frequency control circuit 714 adjusts the frequency of the DC-BAW 702 such that the frequency of output of the divider 706 is the same as the frequency of output of the divider 708, and the frequency control circuit 716 adjusts the frequency of the DC-BAW 704 such that the frequency of output of the divider 708 is the same as the frequency of output of the divider 706. Temperature compensated output signal may be provided at the output of the DC-BAW 702 or the output of the DC-BAW 704.

The delta-sigma modulator 718 modulates the output of the frequency control circuit 714. An input of the delta-sigma modulator 718 is coupled to the output of the frequency control circuit 714, and an output of the delta-sigma modulator 718 is coupled to a control input of the DC-BAW 702 to control the tuning capacitors of the DC-BAW 702. The delta-sigma modulator 720 modulates the output of the frequency control circuit 716. An input of the delta-sigma modulator 720 is coupled to the output of the frequency control circuit 716, and an output of the delta-sigma modulator 720 is coupled to a control input of the DC-BAW 704 to control the tuning capacitors of the DC-BAW 704. The delta-sigma modulator 718 and the delta-sigma modulator 720 may be omitted from some implementations of the temperature compensated dual BAW oscillator 700.

In the temperature compensated dual BAW oscillator 700, the free running frequencies of the DC-BAW 702 and the DC-BAW 704 may respectively be provided as:

$$f_1(T,x_e) = p_1(T) + \beta_1(x_e) + f_{o1}, \text{ and} \quad (1)$$

$$f_2(T,x_e) = p_2(T) + \beta_2(x_e) + f_{o2}. \quad (2)$$

where:
T is temperature;
$p_1$ is a polynomial representing DC-BAW 702 frequency dependence on temperature;
$p_2$ is a polynomial representing DC-BAW 704 frequency dependence on temperature;
$\beta_1$ is a polynomial function complementary to p1 such that $p1(T) + \beta_1(T) = 0$ for all T;
$\beta_2$ is a polynomial function complementary to p2 such that $p2(T) + \beta_2(T) = 0$ for all T;
$f_{o1}$ is oscillation frequency of DC-BAW 702 at a reference temperature and with $x_e = 0$; and
$f_{o2}$ is oscillation frequency of DC-BAW 704 at a reference temperature and with $x_e = 0$.

The polynomials applied in the frequency control circuit 714 and the frequency control circuit 716 are respectively selected as:

$$\beta_1(x) = p_1(x), \text{ and} \quad (3)$$

$$\beta_2(x) = p_2(x). \quad (4)$$

At lock:

$$f_1(T,x_e) = f_2(T,x_e), \text{ and} \quad (5)$$

$$p_1(T) - p_1(x_e) = p_2(T) - p_2(x_e) \text{ and} \quad (6)$$

Having a solution at:

$$x_e T, \quad (7)$$

which yields:

$$f_1(T,x_e) = f_{o1}. \quad (8)$$

Figure 8:
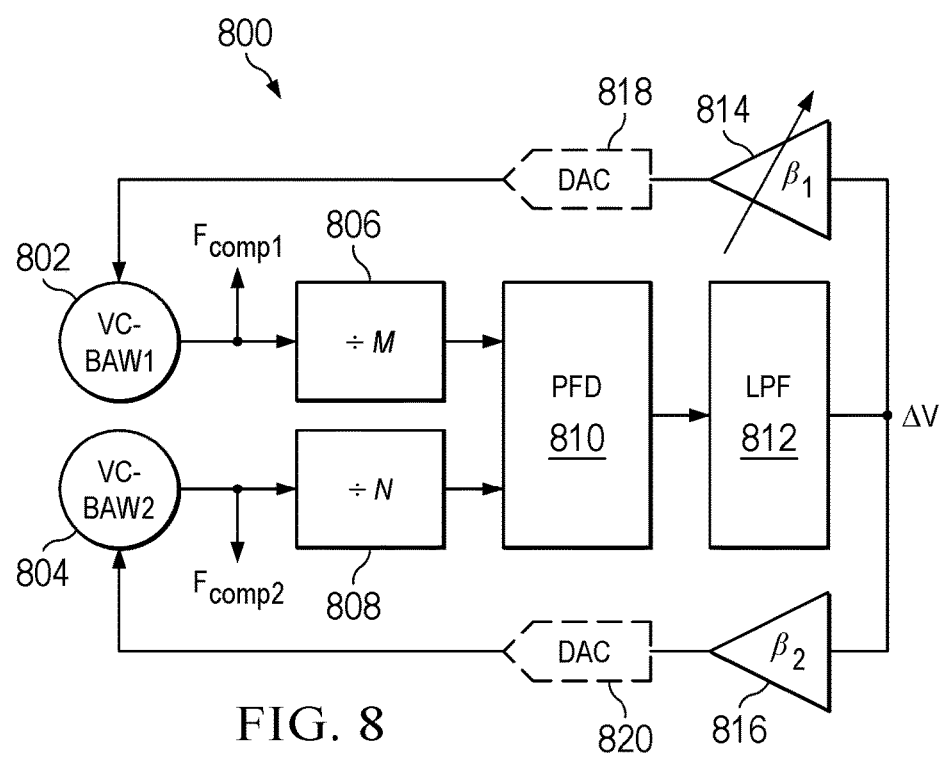
FIG. 8 shows a block diagram for another example temperature compensated dual BAW oscillator.

FIG. 8 shows a block diagram for another embodiment of a temperature compensated dual BAW oscillator 800. The temperature compensated dual BAW oscillator 800 uses analog tuning to provide continuous and fast tracking. The temperature compensated dual BAW oscillator 800 includes a voltage-controlled BAW (VC-BAW) 802, a VC-BAW 804, a divider 806, a divider 808, a phase/frequency detector 810, a low-pass filter 812, a frequency control circuit 814, a frequency control circuit 816, a digital-to-analog converter (DAC) 818, and a DAC 820. The VC-BAW 802 and the VC-BAW 804 may include a voltage-controlled capacitor (e.g., a varactor) to adjust the output frequency.

The divider 806 divides the frequency of output signal of the VC-BAW 802 by a constant (M). An input of the divider 806 is coupled to the output of the VC-BAW 802. The divider 808 divides the frequency of output signal of the VC-BAW 804 by a constant (N). An input of the divider 808 is coupled to the output of the VC-BAW 804. M and N may be arbitrary, and be 1 in some implementations, allowing for different fundamental frequencies of the VC-BAW 802 and the VC-BAW 804.

The phase/frequency detector 810 measures the difference in phase/frequency of the output signals of the divider 806 and the divider 808. A first input of the phase/frequency detector 810 is coupled to the output of the divider 806, and a second input of the phase/frequency detector 810 is coupled to the output of the divider 808. The low-pass filter 812 low-pass filters (smooths) the output signal of the phase/frequency detector 810. An input of the low-pass filter 812 is coupled to the output of the phase/frequency detector 810.

The frequency control circuit 814 adjusts the frequency of the VC-BAW 802 based on the output ($\Delta V$) of the low-pass filter 812. Similarly, the frequency control circuit 816 adjusts the frequency of the VC-BAW 804 based on $\Delta V$. More specifically, the frequency control circuit 814 adjusts the frequency of the VC-BAW 802 such that the frequency of output of the divider 806 is the same as the frequency of output of the divider 808, and the frequency control circuit 816 adjusts the frequency of the VC-BAW 804 such that the frequency of output of the divider 808 is the same as the frequency of output of the divider 806. Temperature compensated output signal may be provided at the output of the VC-BAW 802 or the output of the VC-BAW 804.

The phase/frequency detector 810, the low-pass filter 812, the frequency control circuit 814, and the frequency control circuit 816 may be implemented as analog circuits or as digital circuits. In embodiments of the temperature compensated dual BAW oscillator 800 in which the frequency control circuit 814 and the frequency control circuit 816 are implemented as digital circuits, the DAC 818 and the DAC 820 are included to convert the digital outputs of the frequency control circuit 814 and frequency control circuit 816 to analog signals suitable for controlling the VC-BAW 802 and the VC-BAW 804. The DAC 818 and the DAC 820 are not included in embodiments of the temperature compensated dual BAW oscillator 800 in which the frequency control circuit 814 and the frequency control circuit 816 are implemented as analog circuits.

In the temperature compensated dual BAW oscillator 800, the free running frequencies of the VC-BAW 802 and the VC-BAW 804 may respectively be provided as:

$$f_1(\Delta T, \Delta V) = \alpha_1 \Delta T + \beta_1 \Delta V + f_{o1}, \text{ and} \quad (9)$$

$$f_2(\Delta T, \Delta V) = \alpha_2 \Delta T + \beta_2 \Delta V + f_{o2} \quad (10)$$

where:
T is temperature;
$\alpha_1$ is VC-BAW 802 frequency dependence on temperature;
$\alpha_2$ is VC-BAW 804 frequency dependence on temperature;
$\beta_1$ is a gain or attenuation coefficient adjusted in the 814 to track temperature;
$\beta_2$ is a gain or attenuation coefficient adjusted in the 816 to track temperature;

At lock:

$$f_1(\Delta T, \Delta V) = f_2(\Delta T, \Delta V), \text{ and} \qquad (11)$$

$$\Delta V_l = \frac{\alpha_1 - \alpha_2}{\beta_2 - \beta_1} \Delta T, \text{ and} \qquad (12)$$

$$f_1(\Delta T, \Delta V) = \alpha_1 \Delta T + \beta_1 \frac{\alpha_1 - \alpha_2}{\beta_2 - \beta_1} \Delta T + f_{o1}, \qquad (13)$$

$$f_1(\Delta T, \Delta V) = \frac{\alpha_1(\beta_2 - \beta_1) + \beta_1(\alpha_1 - \alpha_2)}{\beta_2 - \beta_1} \Delta T + f_{o1}, \text{ and} \qquad (14)$$

$$f_1(\Delta T, \Delta V) = \frac{\alpha_1 \beta_2 + \alpha_2 \beta_1}{\beta_2 - \beta_1} \Delta T + f_{o1}, \qquad (15)$$

If $\alpha_1 \beta_2 = \beta_1 \alpha_2$ is chosen, then $$f_1(\Delta T, \Delta V) = f_{o1}, \qquad (16)$$

In this description, the term "couple" or "couples" may cover connections, communications, or signal paths that enable a functional relationship consistent with this description. For example, if device A generates a signal to control device B to perform an action: (a) in a first example, device A is coupled to device B; or (b) in a second example, device A is coupled to device B through intervening component C if intervening component C does not substantially alter the functional relationship between device A and device B, such that device B is controlled by device A via the control signal generated by device A. Also, in this description, the recitation "based on" means "based at least in part on." Therefore, if X is based on Y, then X may be a function of Y and any number of other factors.

Modifications are possible in the described embodiments, and other embodiments are possible, within the scope of the claims.

What is claimed is:

1. An apparatus, comprising:
    a first oscillator having a first oscillator output;
    a second oscillator having a second oscillator output;
    a processing circuit having first and second inputs and a processing output, the first input coupled to the first oscillator output, the second input coupled to the second oscillator output, and the processing circuit configured to provide a temperature compensation signal at the processing output responsive to at least one of a frequency difference or a phase difference between: a first oscillating signal at the first input; and a second oscillating signal at the second input; and
    a signal generator circuit having a generator control input and a generator output, the generator control input coupled to the processing output, and the signal generator circuit configured to provide a third oscillating signal at the generator output responsive to the temperature compensation signal, in which the third oscillating signal is either: a temperature-compensated version of the first oscillating signal; or a temperature-compensated version of the second oscillating signal.

2. The apparatus claim 1, wherein the signal generator circuit has a generator input coupled to the first oscillator output, the temperature compensation signal represents a scaling factor, and the signal generator circuit is configured to provide the temperature-compensated version of the first oscillating signal by scaling a frequency of the first oscillating signal by the scaling factor.

3. The apparatus of claim 2, further comprising:
    a first frequency divider having a first divider control input, a first divider input, and a first divider output, the first divider input coupled to the first oscillator output, and the first divider output coupled to the first input; and
    a second frequency divider having a second divider control input, a second divider input, and a second divider output, the second divider input coupled to the second oscillator output, and the second divider output coupled to the second input; and
    wherein the processing circuit has first and second divider control outputs, the processing circuit configured to:
        provide a first divisor signal at the first divider control output, the first divisor signal representing a first divisor value; and
        provide a second divisor signal at the second divider control output responsive to the at least one of the frequency difference or the phase difference, the second divisor signal representing a second divisor value.

4. The apparatus of claim 3, further comprising:
    a first delta-sigma modulator having a first modulator input and a first modulator output, the first modulator input coupled to the first divider control output, and the first modulator output coupled to the first divider control input; and
    a second delta-sigma modulator having a second modulator input and a second modulator output, the second modulator input coupled to the second divider control output, and the second modulator output coupled to the second divider control input.

5. The apparatus of claim 3, wherein the processing circuit includes:
    a phase-frequency detector (PFD) having first and second PFD inputs input and a PFD output, the first PFD input coupled to the first input, and the second PFD input coupled to the second input;
    a first filter having a first filter input and a first filter output, the first filter input coupled to the PFD output, and the first filter output coupled to the second divider control output; and
    a second filter having a second filter input and a second filter output, the second filter input coupled to the first filter output, and the second filter output coupled to the processing output.

6. The apparatus of claim 3, wherein the processing circuit is configured to provide the temperature compensation signal based on the first and second divisor values.

7. The apparatus of claim 3, wherein the signal generator circuit includes the second frequency divider, the second divider input coupled to the second oscillator output via the generator input, the second divider output coupled to the generator output, the second divider control input coupled to the generator control input, and the second divisor signal includes the temperature compensation signal.

8. The apparatus of claim 7, wherein:
the signal generator circuit is a first signal generator circuit;
the generator input is a first generator input;
the generator control input is a first generator control input;
the generator output is a first generator output; and
the apparatus further comprises a second signal generator circuit having a second generator input, a second generator control input, and a second generator output, the second signal generator circuit including the first frequency divider, the first divider input coupled to the first oscillator output via the second generator input, the first divider output coupled to the second generator output, the first divider control input coupled to the second generator control input, and the first divisor signal includes the temperature compensation signal.

9. The apparatus of claim 3, wherein the processing circuit is configured to provide the first divisor signal responsive to the at least one of the frequency difference or the phase difference.

10. The apparatus of claim 1, wherein:
the first oscillator includes a first bulk acoustic wave (BAW) resonator; and
the second oscillator includes a second BAW resonator.

11. The apparatus of claim 1, wherein:
the signal generator circuit is a first signal generator circuit;
the generator control input is a first generator control input;
the generator output is a first generator output;
the first signal generator circuit is configured to provide the temperature-compensated version of the first oscillating signal at the first generator output responsive to the temperature compensation signal; and
the apparatus further comprises a second signal generator circuit having a second generator control input and a second generator output, and the second signal generator circuit configured to provide the temperature-compensated version of the second oscillating signal at the second generator output responsive to the temperature compensation signal.

12. The apparatus of claim 1, wherein the signal generator circuit includes the first oscillator, the first oscillator output coupled to the generator output, and the first oscillator has a frequency control input coupled to the generator control input.

13. The apparatus of claim 12, wherein:
the generator control input is a first generator control input;
the generator output is a first generator output;
the frequency control input is a first frequency control input;
the apparatus further includes a second signal generator circuit having a second generator control input and a second generator output;
the second signal generator circuit includes the second oscillator;
the second generator output is coupled to the second oscillator output; and
the second oscillator has a second frequency control input coupled to the second generator control input.

14. The apparatus of claim 13, further comprising:
a first frequency compensation circuit having a first frequency compensation input and a first frequency compensation output, the first frequency compensation input coupled to the processing output, and the first frequency compensation output coupled to the first generator control input; and
a second frequency compensation circuit having a second frequency compensation input and a second frequency compensation output, the second frequency compensation input coupled to the processing output, and the second frequency compensation output coupled to the second generator control input.

15. An apparatus, comprising:
a first oscillator having a first oscillator output;
a second oscillator having a second oscillator output;
a first frequency divider having a first divider control input, a first divider input, and a first divider output, the first divider input coupled to the first oscillator output;
a second frequency divider having a second divider control input, a second divider input, and a second divider output, the second divider input coupled to the second oscillator output;
a processing circuit having first and second inputs, first and second divider control outputs, and a processing output, the first input coupled to the first divider output, the second input coupled to the second divider output, the first divider control output coupled to the first divider control input, the second divider control output coupled to the second divider control input, and the processing circuit configured to:
provide a first divisor signal at the first divider control output, the first divisor signal representing a first divisor value;
provide a second divisor signal at the second divider control output responsive to a first oscillating signal at the first input and a second oscillating signal at the second input, the second divisor signal representing a second divisor value; and
provide a temperature compensation signal at the processing output based on the first and second divisor values.

16. The apparatus of claim 15, further comprising a signal generator circuit having a generator control input and a generator output, the generator control input coupled to the processing output, and the signal generator circuit configured to provide a third oscillating signal at the generator output responsive to the temperature compensation signal, in which the third oscillating signal is either: a temperature-compensated version of the first oscillating signal; or a temperature-compensated version of the second oscillating signal.

17. The apparatus of claim 16, wherein:
the signal generator circuit is a first signal generator circuit, the generator output is a first generator output, and the first signal generator circuit is configured to provide the temperature-compensated version of the first oscillating signal at the first generator output; and
the apparatus further comprises a second signal generator circuit having a second generator control input and a second generator output, the second generator control input coupled to the processing output, and the second signal generator circuit configured to provide the temperature-compensated version of the second oscillating signal at the second generator output responsive to the temperature compensation signal.

18. The apparatus of claim 16, wherein the signal generator circuit has a generator input and includes the second frequency divider, the second divider input coupled to the second oscillator output via the generator input, the second divider output coupled to the generator output, the second divider control input coupled to the generator control input, and the second divisor signal includes the temperature compensation signal.

19. The apparatus of claim 15, further comprising:
a first delta-sigma modulator having a first modulator input and a first modulator output, the first modulator input coupled to the first divider control output, and the first modulator output coupled to the first divider control input; and
a second delta-sigma modulator having a second modulator input and a second modulator output, the second modulator input coupled to the second divider control output, and the second modulator output coupled to the second divider control input.

20. The apparatus of claim 15, wherein the processing circuit includes:
a phase-frequency detector (PFD) having first and second PFD inputs and a PFD output, the first PFD input coupled to the first input, the second PFD input coupled to the second input;
a first filter having a first filter input and a first filter output, the first filter input coupled to the PFD output, and the first filter output coupled to the second divider control output; and
a second filter having a second filter input and a second filter output, the second filter input coupled to the first filter output, and the second filter output coupled to the processing output.

21. The apparatus of claim 15, wherein
the first oscillator includes a first bulk acoustic wave (BAW) resonator having a first temperature sensitivity; and
the second oscillator includes a second BAW resonator having a second temperature sensitivity; and
the first temperature sensitivity is different from the second temperature sensitivity.

22. The apparatus of claim 15, wherein the processing circuit is configured to provide the first divisor signal responsive to the first and second oscillating signals.

23. An apparatus, comprising:
a first oscillator having a first frequency control input and a first oscillator output;
a second oscillator having a second frequency control input and a second oscillator output;
a processing circuit having first and second inputs and a processing output, the first input coupled to the first oscillator output, and the second input coupled to the second oscillator output;
a first frequency compensation circuit having a first frequency compensation input and a first frequency compensation output, the first frequency compensation input coupled to the processing output, and the first frequency compensation output coupled to the first frequency control input; and
a second frequency compensation circuit having a second frequency compensation input and a second frequency compensation output, the second frequency compensation input coupled to the processing output, and the second frequency compensation output coupled to the second frequency control input.

24. The apparatus of claim 23, further comprising:
a first frequency divider having a first divider input and a first divider output, the first divider input coupled to the first oscillator output, and the first divider output coupled to the first input; and
a second frequency divider having a second divider input and a second divider output, the second divider input coupled to the second oscillator output, and the second divider output coupled to the second input.

25. The apparatus of claim 24, wherein:
the first frequency divider is configured to divide a frequency of a first oscillating signal from the first oscillator by a first divisor;
the second frequency divider is configured to divide a frequency of a second oscillating signal from the second oscillator by a second divisor; and
the first divisor is different from the second divisor.

26. The apparatus of claim 23, further comprising:
a first delta-sigma modulator having a first modulator input and a first modulator output, the first modulator input coupled to the first frequency compensation output, and the first modulator output coupled to the first frequency control input; and
a second delta-sigma modulator having a second modulator input and a second modulator output, the second modulator input coupled to the second frequency compensation input, and the second modulator output coupled to the second frequency control input.

27. The apparatus of claim 23, wherein the processing circuit includes:
a phase-frequency detector (PFD) having first and second PFD inputs and a PFD output, the first PFD input coupled to the first input, the second PFD input coupled to the second input; and
a filter having a filter input and a filter output, the filter input coupled to the PFD output, and the filter output coupled to the processing output.

28. The apparatus of claim 23, further comprising:
a first digital-to-analog converter (DAC) having a first digital input and a first analog output, the first digital input coupled to the first frequency compensation output, and the first analog output coupled to the first frequency control input; and
a second DAC having a second digital input and a second analog output, the second digital input coupled to the second frequency compensation output, and the second analog output coupled to the second frequency control input.

29. The apparatus of claim 23, wherein:
the first oscillator includes a first bulk acoustic wave (BAW) resonator; and
the second oscillator includes a second BAW resonator.

30. The apparatus of claim 29, wherein:
the first frequency compensation circuit is configured to provide a first frequency control signal at the first frequency compensation output responsive to a temperature compensation signal at the first frequency compensation input, in which the first frequency control signal and the temperature compensation signal have a first relationship;
the second frequency compensation circuit is configured to provide a second frequency control signal at the second frequency compensation output responsive to the temperature compensation signal at the second frequency compensation input, in which the second frequency control signal and the temperature compensation signal have a second relationship; and
the first relationship and the second relationship are based on a first temperature sensitivity of the first oscillator and a second temperature sensitivity of the second oscillator.

* * * * *